(12) United States Patent
Koyama et al.

(10) Patent No.: US 11,404,294 B2
(45) Date of Patent: Aug. 2, 2022

(54) SUBSTRATE PROCESSING APPARATUS, SUBSTRATE PROCESSING METHOD, AND STORAGE MEDIUM

(71) Applicant: Tokyo Electron Limited, Tokyo (JP)

(72) Inventors: Kazuya Koyama, Kumamoto (JP);
Kotaro Tsurusaki, Kumamoto (JP);
Koji Yamashita, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 268 days.

(21) Appl. No.: 16/804,056

(22) Filed: Feb. 28, 2020

(65) Prior Publication Data
US 2020/0286751 A1 Sep. 10, 2020

(30) Foreign Application Priority Data
Mar. 4, 2019 (JP) .............................. JP2019-038819

(51) Int. Cl.
*H01L 21/67* (2006.01)
*H01L 21/687* (2006.01)

(52) U.S. Cl.
CPC .... *H01L 21/6715* (2013.01); *H01L 21/67034* (2013.01); *H01L 21/67057* (2013.01); *H01L 21/68742* (2013.01)

(58) Field of Classification Search
CPC ......... H01L 21/67057; H01L 21/67028; H01L 21/67034; H01L 21/67712
See application file for complete search history.

(56) References Cited

FOREIGN PATENT DOCUMENTS

JP 2000-091301 A 3/2000
JP 2013125812 A * 6/2013

OTHER PUBLICATIONS

Machine translation: JP2013125812; Higuchi et al. (Year: 2013).*

* cited by examiner

*Primary Examiner* — Natasha N Campbell
(74) *Attorney, Agent, or Firm* — Venjuris, P.C.

(57) ABSTRACT

A substrate processing apparatus includes a liquid processing tank, a movement mechanism, an ejector, and a controller. The liquid processing tank stores a processing liquid. The movement mechanism moves a plurality of substrates immersed in the liquid processing tank to above the liquid surface of the processing liquid. The ejector ejects a vapor of an organic solvent toward portions of the plurality of substrates exposed from the liquid surfaces. The controller moves up the ejection position of the vapor of the organic solvent by the ejection unit as the plurality of substrates are moved up.

18 Claims, 15 Drawing Sheets

SUBSTRATE PROCESSING APPARATUS, SUBSTRATE PROCESSING METHOD, AND STORAGE MEDIUM

CROSS-REFERENCE TO RELATED APPLICATIONS

This application is based on and claims priority from Japanese Patent Application No. 2019-038819, filed on Mar. 4, 2019 with the Japan Patent Office, the disclosure of which is incorporated herein in its entirety by reference.

TECHNICAL FIELD

The present disclosure relates to a substrate processing apparatus, a substrate processing method, and a storage medium.

BACKGROUND

In the related art, there is known a substrate processing apparatus which replaces a processing liquid attached to a substrate with an organic solvent by bringing the substrate into contact with a vapor of the organic solvent after a liquid processing, and then, dries the substrate by volatilizing the organic solvent attached to the substrate.

Japanese Patent Laid-Open Publication No. 2000-091301 discloses a substrate processing apparatus including a liquid processing tank that stores a processing liquid, a drying chamber disposed above the liquid processing tank and provided with a supply that supplies a vapor of an organic solvent, and a movement mechanism that moves a plurality of substrates between the liquid processing tank and the drying chamber.

SUMMARY

A substrate processing apparatus in accordance with an aspect of the present disclosure includes a liquid processing tank, a movement mechanism, an ejector, and a controller. The liquid processing tank stores a processing liquid therein. The movement mechanism moves a plurality of substrates immersed in the liquid processing tank to a position above the liquid surface of the processing liquid. The ejector ejects a vapor of an organic solvent toward portions of the plurality of substrates exposed from the liquid surface. The controller moves up the ejection position of the vapor by the ejector as the plurality of substrates are moved up.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
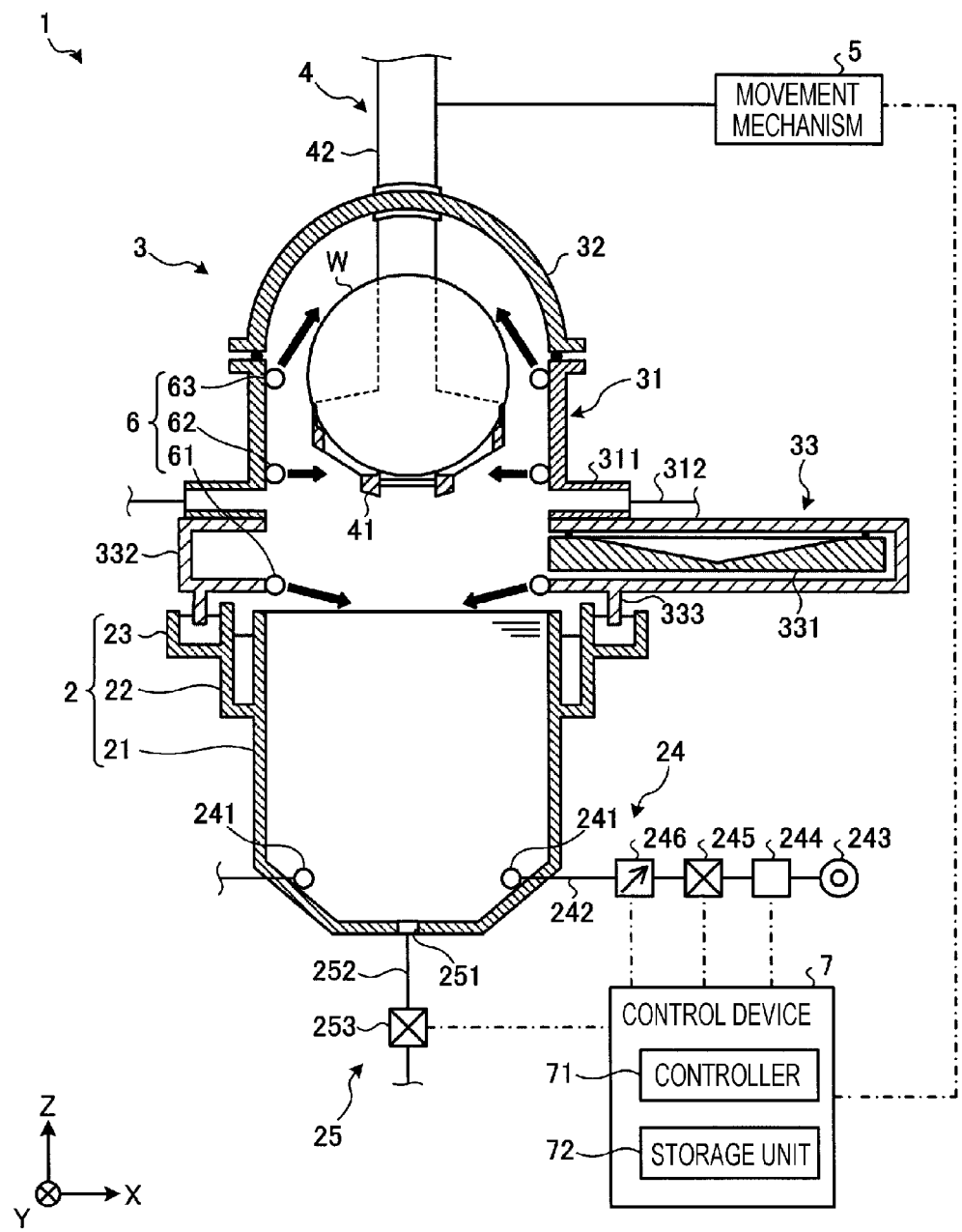
FIG. 1 is a cross-sectional view of a substrate processing apparatus according to a first embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments for implementing a substrate processing apparatus, a substrate processing method, and a storage medium according to the present disclosure (hereinafter, referred to as "embodiments") will be described in detail with reference to the accompanying drawings. In addition, the embodiments do not limit the substrate processing apparatus, the substrate processing method, and the storage medium according to the present disclosure. Further, the respective embodiments may be appropriately combined within a range that does not contradict processing contents. Further, in the following respective embodiments, the same parts will be denoted by the same reference numerals, and redundant descriptions thereof will be omitted.

Further, in each of the drawings referred to below, for easy understanding of the description, an orthogonal coordinate system in which the X-axis direction, the Y-axis direction, and the Z-axis direction which are orthogonal to each other are defined and the positive Z-axis direction is referred to as a vertically upward direction is occasionally illustrated.

First Embodiment

<Configuration of Substrate Processing Apparatus>

Figure 2:
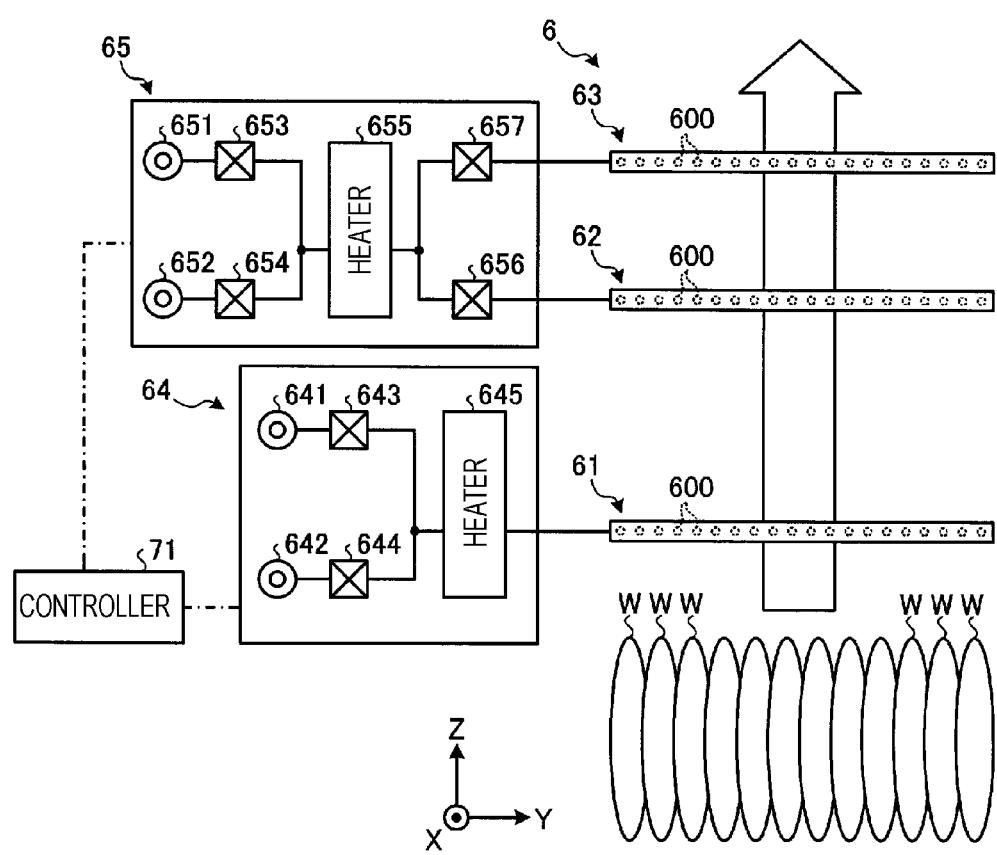
FIG. 2 is a diagram illustrating a configuration of an ejector according to the first embodiment.

First, a configuration of a substrate processing apparatus according to a first embodiment will be described with reference to FIGS. 1 and 2. FIG. 1 is a schematic cross-sectional view of the substrate processing apparatus according to the first embodiment. Further, FIG. 2 is a diagram illustrating a configuration of a ejector according to the first embodiment.

As illustrated in FIG. 1, the substrate processing apparatus 1 according to the first embodiment includes a liquid processing tank 2, a drying chamber 3, a holder 4, a movement mechanism 5, a gas ejector 6, and a control device 7.

(Liquid Processing Tank 2)

The liquid processing tank 2 includes a storage tank 21, an overflow tank 22, and a seal tank 23. The liquid processing tank 2 may accommodate a plurality of semiconductor substrates (hereinafter, referred to as "wafers W") arranged in a vertical posture (vertical orientation). In the liquid processing tank 2, a liquid processing of processing the plurality of wafers W by immersing the plurality of wafers W in a processing liquid stored therein is performed. Here, it is assumed that deionized water is used as the processing liquid. Further, it is assumed that a cleaning processing of the plurality of wafers W with deionized water is performed as the liquid processing.

The storage tank 21 is provided with a liquid ejector 24 that performs the supply of the processing liquid and a drainage mechanism 25 that performs the ejection of the processing liquid.

The liquid ejector 24 includes a plurality of (here, two) nozzles 241, a supply path 242, a processing liquid supply source 243, a cooler 244, a valve 245, and a flow controller 246. The two nozzles 241 are provided on the inner bottom of the storage tank 21. The supply path 242 connects the two nozzles 241 and the processing liquid supply source 243 to each other. The processing liquid supply source 243 supplies the processing liquid to the two nozzles 241.

The cooler 244 is, for example, a chiller, and cools the processing liquid supplied from the processing liquid supply source 243. For example, the temperature of the processing liquid supplied from the processing liquid supply source 243 is room temperature, and the cooler 244 cools the processing liquid supplied from the processing liquid supply source 243 to a temperature equal to or less than room temperature (e.g., 20° C. or lower).

The valve 245 opens and closes the supply path 242. The flow controller 246 adjusts the flow rate of the processing liquid flowing through the supply path 242. The cooler 244, the valve 245, and the flow controller 246 are electrically connected to a controller 71 of the control device 7 and are controlled by the controller 71.

The drainage mechanism 25 includes a drain port 251, a drain path 252, and a valve 253. The drain port 251 is provided in the center of the inner bottom of the storage tank 21. The drain path 252 is connected to the drain port 251. The valve 253 is provided on a middle portion of the drain path 252, and opens and closes the drain path 252. The valve 253 is electrically connected to the controller 71 and is controlled to be opened and closed by the controller 71.

The overflow tank 22 is formed on the outer periphery of the upper end of the storage tank 21, and stores the processing liquid overflowing from the storage tank 21. The seal tank 23 is formed on the outer periphery of the upper end of the overflow tank 22, and stores a liquid such as water. By immersing a seal wall 333 to be described later in the liquid stored in the seal tank 23, the inside and the outside of the liquid processing tank 2 may be shielded.

(Drying Chamber 3)

The drying chamber 3 is disposed above the liquid processing tank 2, and has an internal space communicating with the storage tank 21. The drying chamber 3 includes a main body 31, a lid 32, and a shielding unit 33. The upper and lower sides of the main body 31 are open. The main body 31 is provided with a plurality of (here, two) exhaust ports 311. The two exhaust ports 311 are provided horizontally symmetrically in the lower portion of the side surface of the main body 31 located in the direction (X-axis direction) orthogonal to the direction (Y-axis direction) in which the plurality of wafers W are arranged. The two exhaust ports 311 are connected to an exhaust path 312, and the atmosphere in the drying chamber 3 is exhausted to the outside through the exhaust ports 311 and the exhaust path 312.

The lid 32 is disposed above the main body 31, and closes an upper opening in the main body 31. The lid 32 is configured to be able to be moved up and down by a movement mechanism (not illustrated). By moving up the lid 32, the plurality of wafers W may be carried into the drying chamber 3 or carried out of the drying chamber 3.

The shielding unit 33 is disposed below the main body 31. The shielding unit 33 includes a shielding door 331 and a case 332. The shielding door 331 is configured to be movable in the horizontal direction (here, the X-axis direction) within the case 332 by a movement mechanism (not illustrated), and closes or opens a lower opening in the main body 31.

The case 332 is interposed between the liquid processing tank 2 and the main body 31, and accommodates the shielding door 331 therein. An opening communicating with the lower opening in the main body 31 is formed in the upper portion of the case 332, and an opening communicating with the upper region of the storage tank 21 is formed in the lower portion of the case 332.

The seal wall 333 is provided on the lower portion of the case 332 to protrude downward. The seal wall 333 is immersed in the liquid stored in the seal tank 23. Thus, the inside and the outside of the liquid processing tank 2 may be shielded.

(Holder 4)

The holder 4 includes a holding body 41 and a shaft 42 that supports the holding body 41. The holding body 41 holds the plurality of wafers W in a vertical posture. Further, the holding body 41 holds the plurality of wafers W in a state where they are arranged at a constant interval in the horizontal direction (here, the Y-axis direction). The shaft 42 extends along the vertical direction, and supports the holding body 41 below thereof. The shaft 42 is slidably inserted through an opening (not illustrated) provided in the upper portion of the lid 32.

(Movement Mechanism 5)

The movement mechanism 5 includes, for example, a motor, a ball screw, and a cylinder, and is connected to the shaft 42 of the holder 4 to move up and down the shaft 42. When the shaft 42 is moved up and down by the movement mechanism 5, the holding body 41 supported by the shaft 42 is moved up and down. Thus, the movement mechanism 5 may move the plurality of wafers W held by the holding body 41 between the storage tank 21 and the drying chamber 3. The movement mechanism 5 is electrically connected to the controller 71 of the control device 7 and is controlled by the controller 71.

(Gas Ejector 6)

The gas ejector 6 includes a plurality of nozzles 61 to 63 arranged in multiple tiers within the drying chamber 3. The plurality of nozzles 61 to 63 are disposed on the side of a moving path of the plurality of wafers W by the movement mechanism 5, and eject a vapor of an organic solvent toward the plurality of wafers W moved up by the movement mechanism 5. Here, it is assumed that isopropyl alcohol (IPA) is used as the organic solvent. That is, the gas ejector 6 ejects a vapor of IPA (hereinafter, referred to as "IPA vapor") toward the plurality of wafers W. In addition, the organic solvent is not limited to IPA.

As illustrated in FIG. 2, the nozzles 61 to 63 have a long shape extending along the direction (Y-axis direction) in which the plurality of wafers W are arranged. The nozzles 61 to 63 are provided with a plurality of ejection ports 600 along the longitudinal direction. As the ejection port 600, in addition to a simplified opening, a spray nozzle tip may be used to spray an IPA vapor in a mist form. Further, the nozzles 61 to 63 may respectively have slit-shaped ejection ports extending in the longitudinal direction instead of the plurality of ejection ports 600.

Among the nozzles 61 to 63, the lower nozzle 61 disposed at the lowermost tier is connected to a first supply system 64. The first supply system 64 includes an IPA supply source 641, an $N_2$ supply source 642, valves 643 and 644, and a heater 645. The IPA supply source 641 supplies IPA in a liquid state, and the $N_2$ supply source 642 supplies $N_2$ gas which is an inert gas.

The IPA supply source 641 is connected to the heater 645 via the valve 643, and the $N_2$ supply source 642 is connected to the heater 645 via the valve 644. The valves 643 and 644 are electrically connected to the controller 71 and are controlled to be opened and closed by the controller 71.

When both the valves 643 and 644 are opened, a mixed fluid of IPA supplied from the IPA supply source 641 and $N_2$ gas supplied from the $N_2$ supply source 642 is supplied to the heater 645. The heater 645 heats the mixed fluid to generate an IPA vapor. In addition, a two-fluid nozzle (not illustrated) is provided at the subsequent tier of the valve 643, and a mixed fluid of IPA in a mist form and $N_2$ gas is supplied to the heater 645.

Meanwhile, when only the valve 644 is opened, $N_2$ gas is supplied from the $N_2$ supply source 642 to the heater 645. In this case, the heater 645 heats the $N_2$ gas to generate hot $N_2$ gas. The heater 645 is connected to the lower nozzle 61, and supplies the IPA vapor or hot $N_2$ gas.

Among the nozzles 61 to 63, the upper nozzle 63 disposed at the uppermost tier and the middle nozzle 62 disposed between the lower nozzle 61 and the upper nozzle 63 are connected to a second supply system 65.

The second supply system 65 includes an IPA supply source 651, an $N_2$ supply source 652, valves 653, 654, 656 and 657, and a heater 655. The IPA supply source 651 supplies IPA in a liquid state, and the $N_2$ supply source 652 supplies $N_2$ gas which is an inert gas.

The IPA supply source 651 is connected to the heater 655 via the valve 653, and the $N_2$ supply source 652 is connected to the heater 655 via the valve 654. The valves 653 and 654 are electrically connected to the controller 71 and are controlled to be opened and closed by the controller 71.

When both the valves 653 and 654 are opened, the heater 655 heats a mixed fluid of IPA supplied from the IPA supply source 651 and $N_2$ gas supplied from the $N_2$ supply source 652 to generate an IPA vapor. Further, when only the valve 654 is opened, the heater 645 heats $N_2$ gas supplied from the $N_2$ supply source 652 to generate hot $N_2$ gas.

The heater 655 is connected to the middle nozzle 62 via the valve 656, and is connected to the upper nozzle 63 via the valve 657. The valves 656 and 657 are electrically connected to the controller 71 and are controlled to be opened and closed by the controller 71.

Here, an example is illustrated in which the second supply system 65 is provided to supply the IPA vapor or hot $N_2$ gas to the middle nozzle 62 and the upper nozzle 63. Not limited to this, the gas ejector 6 may include a supply unit that supplies the IPA vapor or hot $N_2$ gas to the middle nozzle 62 and a supply unit that supplies the IPA vapor or hot $N_2$ gas to the upper nozzle 63.

As illustrated in FIG. 1, the gas ejector 6 includes, for example, two sets of nozzles 61 to 63. Two lower nozzles 61 are provided horizontally symmetrically on the side surface of the drying chamber 3 located in the direction (X-axis direction) orthogonal to the direction in which the plurality of wafers W are arranged. This is equally applied to two middle nozzles 62 and two upper nozzles 63.

Among the nozzles 61 to 63, the lower nozzle 61 is disposed near the liquid surface of the processing liquid stored in the storage tank 21. Specifically, the lower nozzle 61 is disposed at a position lower than the height position of the upper ends of the plurality of wafers W when the upper halves of the plurality of wafers W have been completely exposed from the liquid surface of the processing liquid. For example, the middle nozzle 62 and the upper nozzle 63 are provided in the main body 31 of the drying chamber 3, whereas the lower nozzle 61 is provided in the shielding unit 33 of the drying chamber 3 closer to the storage tank 21. Specifically, the lower nozzle 61 is provided, for example, on the edge of an opening which is formed in the lower portion of the case 332 of the shielding unit 33 and communicates with the upper region of the storage tank 21.

The two lower nozzles 61 eject the IPA vapor or hot $N_2$ gas obliquely downward toward the plurality of wafers W. Further, the two middle nozzles 62 eject the IPA vapor or hot $N_2$ gas horizontally toward the plurality of wafers W, and the two upper nozzles 63 eject the IPA vapor or hot $N_2$ gas obliquely upward toward the plurality of wafers W.

(Control Device 7)

The control device 7 is, for example, a computer, and includes the controller 71 and a storage unit 72. The storage unit 72 is, for example, implemented by a semiconductor memory device such as a RAM or a flash memory, or a storage device such as a hard disk or an optical disk, and stores a program of controlling various processes executed in the substrate processing apparatus 1. The controller 71 includes a microcomputer having, for example, a central processing unit (CPU), a read only memory (ROM), a random access memory (RAM), and input and output ports, or various circuits, and controls an operation of the substrate processing apparatus 1 by reading and executing the program stored in the storage unit 72.

In addition, such a program may be recorded on a computer-readable storage medium, and may be installed into the storage unit 72 of the control device 7 from the storage medium. The computer-readable storage medium may be, for example, a hard disk (HD), a flexible disk (FD), a compact disk (CD), a magnet optical disk (MO), or a memory card.

<Specific Operation of Substrate Processing Apparatus>

Figure 3:
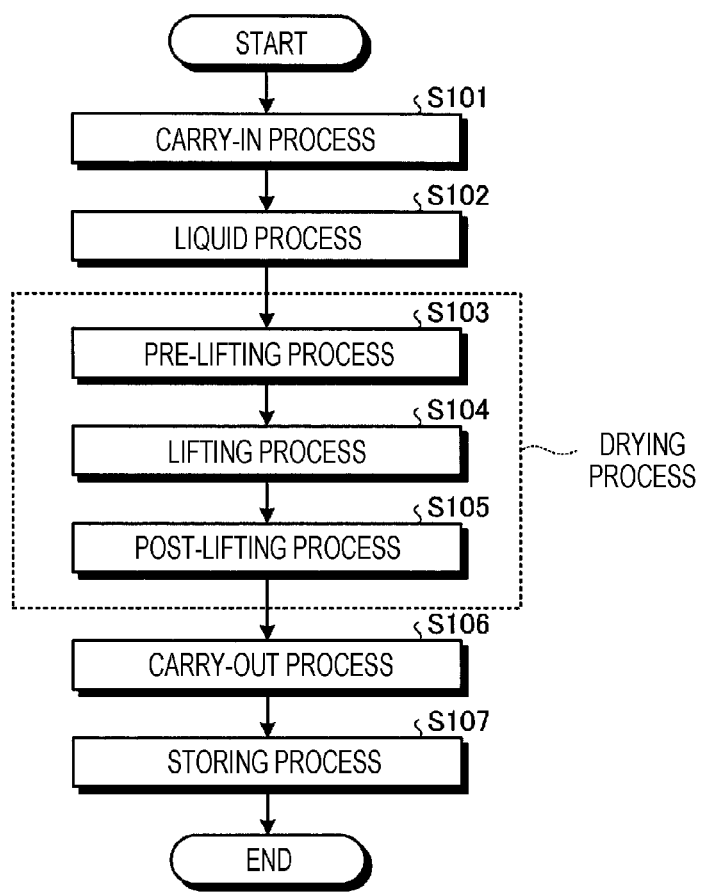
FIG. 3 is a flowchart illustrating an exemplary procedure of processes executed by the substrate processing apparatus according to the first embodiment.
Figure 4:
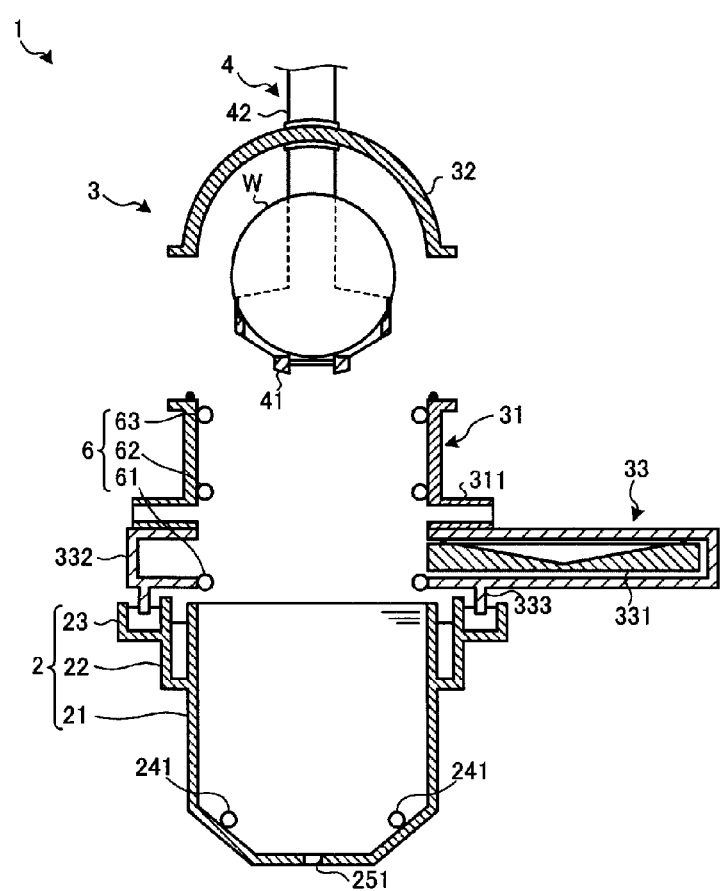
FIG. 4 is a diagram illustrating an exemplary operation of a carry-in process according to the first embodiment.
Figure 5:
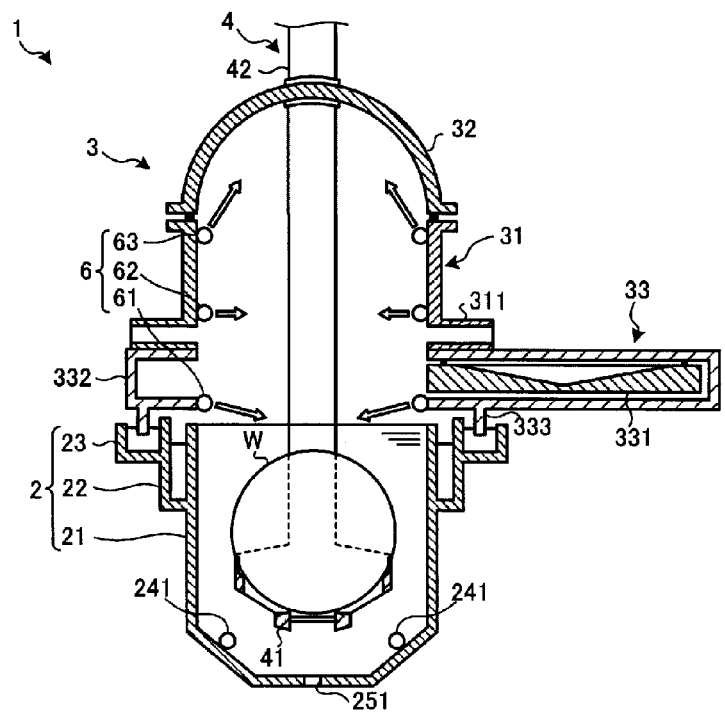
FIG. 5 is a diagram illustrating an exemplary operation of a liquid processing according to the first embodiment.
Figure 6:
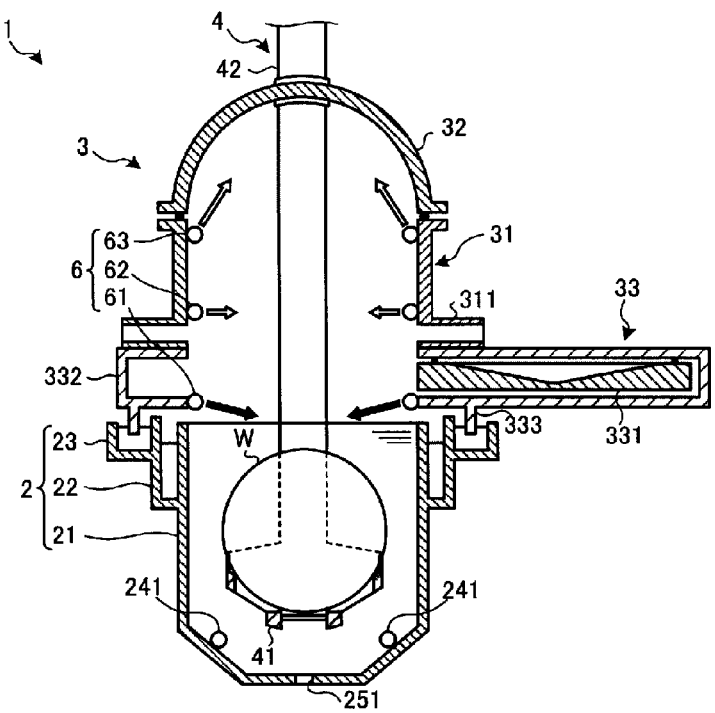
FIG. 6 is a diagram illustrating an exemplary operation of a pre-lifting process according to the first embodiment.
Figure 7:
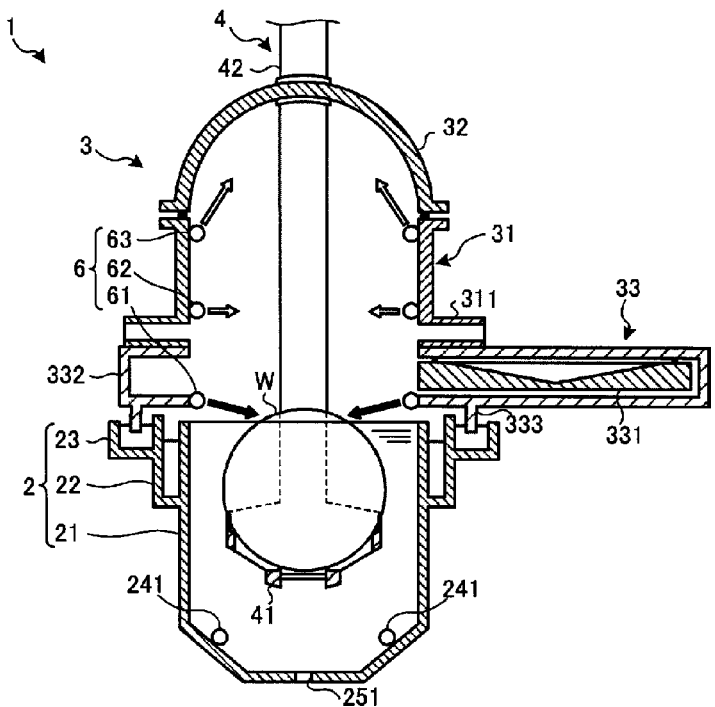
FIG. 7 is a diagram illustrating an exemplary operation of a lifting process according to the first embodiment.
Figure 8:
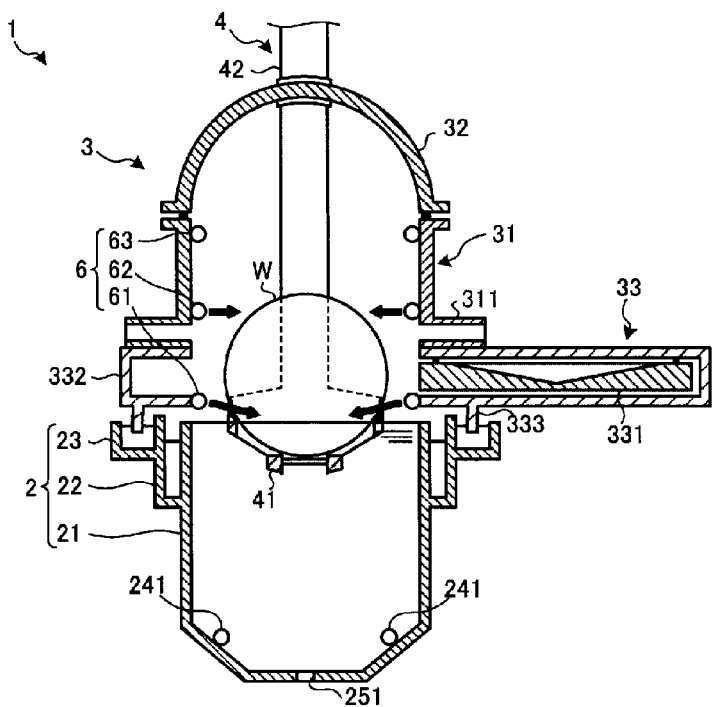
FIG. 8 is a diagram illustrating an exemplary operation of a lifting process according to the first embodiment.
Figure 9:
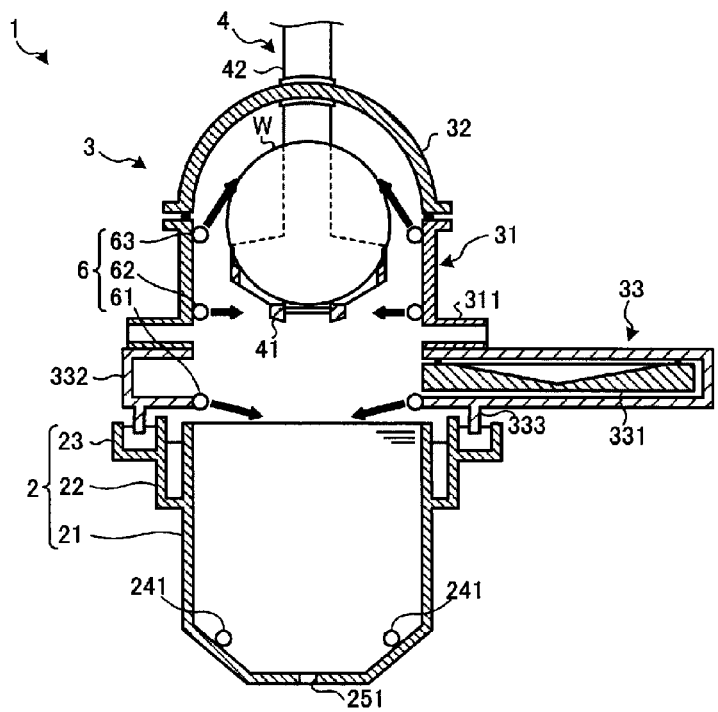
FIG. 9 is a diagram illustrating an exemplary operation of a lifting process according to the first embodiment.
Figure 10:
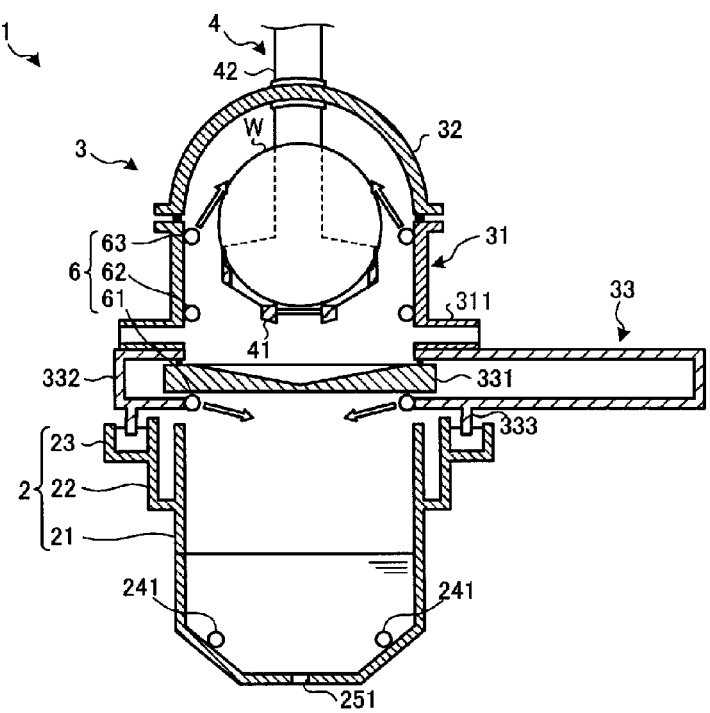
FIG. 10 is a diagram illustrating an exemplary operation of a post-lifting process according to the first embodiment.
Figure 11:
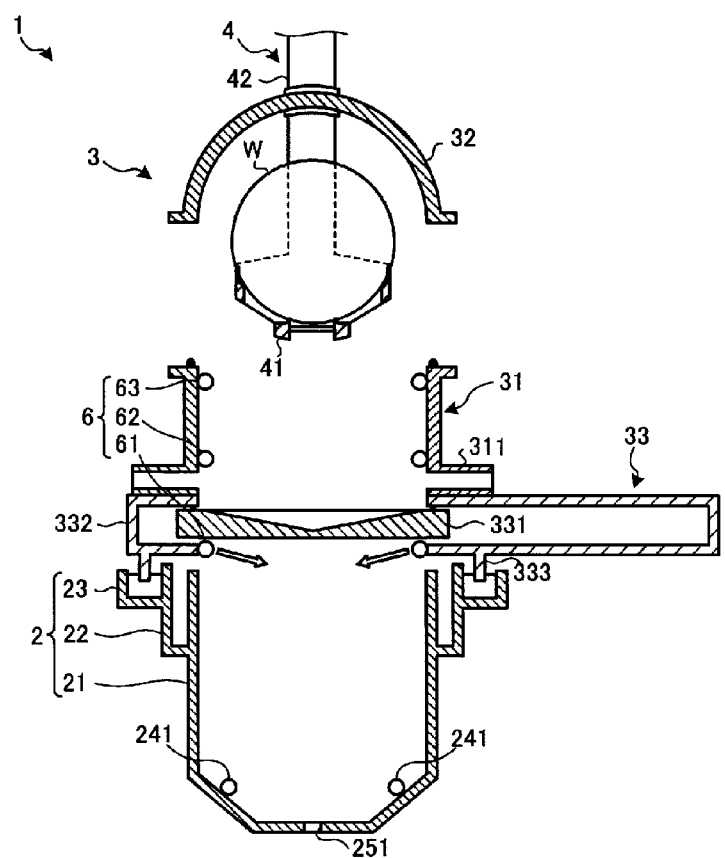
FIG. 11 is a diagram illustrating an exemplary operation of a carry-out process according to the first embodiment.
Figure 12:
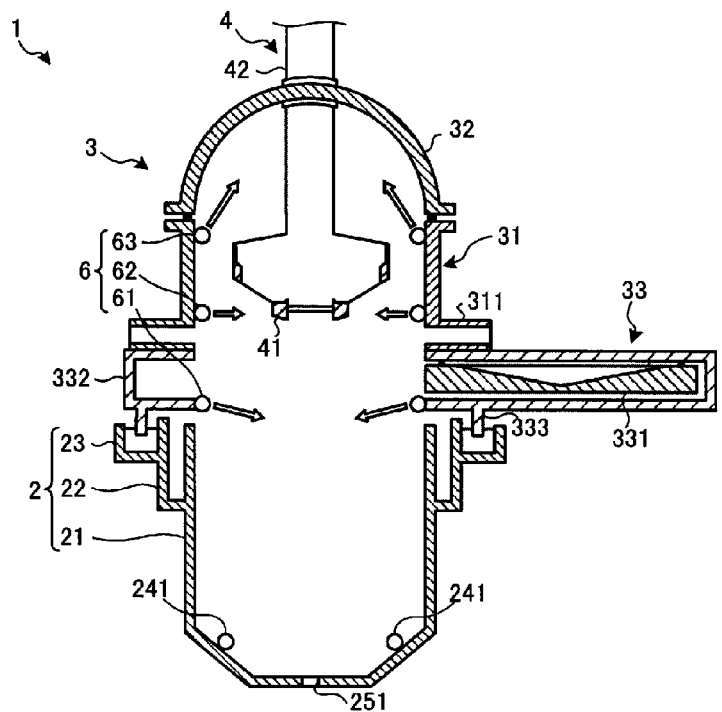
FIG. 12 is a diagram illustrating an exemplary operation of a storing process according to the first embodiment.
Figure 13:
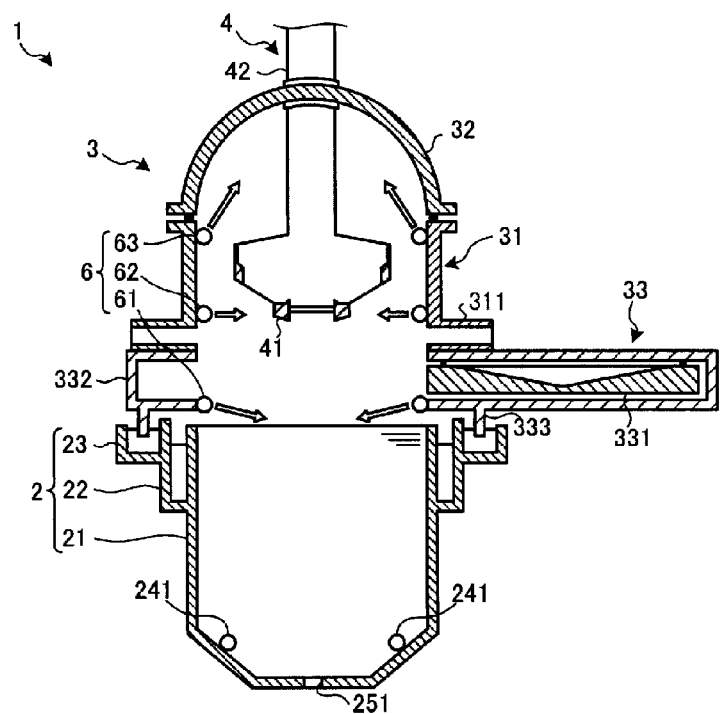
FIG. 13 is a diagram illustrating an exemplary operation of a storing process according to the first embodiment.

Next, a specific operation of the substrate processing apparatus 1 according to the first embodiment will be described with reference to FIGS. 3 to 13. FIG. 3 is a flowchart illustrating an exemplary procedure of processes executed by the substrate processing apparatus 1 according to the embodiment. FIG. 4 is a diagram illustrating an exemplary operation of a carry-in process, and FIG. 5 is a diagram illustrating an exemplary operation of a liquid processing. FIG. 6 is a diagram illustrating an exemplary operation of a pre-lifting process, FIGS. 7 to 9 are diagrams respectively illustrating an exemplary operation of a lifting process, and FIG. 10 is a diagram illustrating an exemplary operation of a post-lifting process. FIG. 11 is a diagram illustrating an exemplary operation of a carry-out process, and FIGS. 12 and 13 are diagrams respectively illustrating an exemplary operation of a storing process.

In addition, in FIGS. 5 to 10, among arrows extending from the nozzles 61 to 63, white arrows indicate that the hot $N_2$ gas is being ejected from the nozzles 61 to 63, and black arrows indicate that the IPA vapor is being ejected from the nozzles 61 to 63.

As illustrated in FIG. 3, in the substrate processing apparatus 1, a carry-in process of carrying the plurality of wafers W into the storage tank 21 is performed (step S101). Specifically, the controller 71 controls a substrate conveyance device (not illustrated) that conveys the plurality of wafers W to transfer the plurality of wafers W to the holding body 41 of the holder 4 (see FIG. 4). Thereafter, the controller 71 controls the movement mechanism 5 to move down the lid 32 and the shaft 42. Thus, the upper opening in the main body 31 of the drying chamber 3 is closed by the lid 32, and the drying chamber 3 is sealed.

Subsequently, in the substrate processing apparatus 1, a liquid processing of processing the plurality of wafers W with the processing liquid is performed (step S102). Specifically, the controller 71 controls the movement mechanism 5 to move down the shaft 42, so that the plurality of wafers W is immersed in the processing liquid stored in the storage tank 21 (see FIG. 5). Thus, the plurality of wafers W are processed with the processing liquid. Here, a rinsing process using deionized water is performed on the plurality of wafers W.

The controller 71 controls the first supply system 64 and the second supply system 65 to eject the hot $N_2$ gas into the drying chamber 3 from the nozzles 61 to 63 during the liquid processing. Thus, oxygen in the drying chamber 3 may be ejected from the exhaust ports 311. Further, prior to a drying process in the subsequent step, the nozzles 61 to 63 may be warmed.

Subsequently, in the substrate processing apparatus 1, a drying process of drying the plurality of wafers W is performed. Specifically, as the drying process, a pre-lifting process (step S103), a lifting process (step S104), and a post-lifting process (step S105) are performed.

First, in the pre-lifting process in step S103, the controller 71 controls the first supply system 64 to switch the gas ejected from the lower nozzle 61 from the hot $N_2$ gas to the IPA vapor (see FIG. 6). Thus, the IPA vapor is ejected from the lower nozzle 61, so that a liquid film of IPA is formed on the liquid surface of the processing liquid stored in the storage tank 21. As described above, the lower nozzle 61 is disposed near the liquid surface of the processing liquid stored in the storage tank 21 and ejects the IPA vapor diagonally downward. Therefore, the liquid film of IPA may be efficiently formed on the liquid surface of the processing liquid.

Subsequently, the lifting process is performed (step S104). In the lifting process, the controller 71 controls the movement mechanism 5 to move up the shaft 42. Thus, the plurality of wafers W start to be exposed from the liquid surface of the processing liquid (see FIG. 7). As described above, the lower nozzle 61 is disposed near the liquid surface of the processing liquid stored in the storage tank 21 and ejects the IPA vapor obliquely downward. Therefore, the lower nozzle 61 may supply the IPA vapor to the plurality of wafers W immediately after the plurality of wafers W are exposed from the liquid surface of the processing liquid. Further, since the ejection of the IPA vapor has already been started in the pre-lifting process, the IPA vapor may be more reliably supplied to the plurality of wafers W immediately after being exposed from the liquid surface of the processing liquid. When the IPA vapor comes into contact with the surfaces of the plurality of wafers W, the processing liquid adhering to the surfaces of the plurality of wafers W is replaced with IPA.

Here, in the related art, a drying chamber is filled with an IPA vapor, and a wafer after a liquid processing is lifted to the drying chamber filled with the IPA vapor, whereby a processing liquid adhering to the wafer is replaced with IPA. However, with the recent miniaturization or high aspect ratio of patterns, a possibility of pattern collapse occurring before the wafer is completely lifted has been increased.

Meanwhile, in the substrate processing apparatus 1, it is assumed that the lower nozzle 61 is disposed near the liquid surface of the processing liquid and the IPA vapor is immediately supplied from the lower nozzle 61 to the wafer W immediately after being exposed from the liquid surface of the processing liquid. Therefore, pattern collapse may be suppressed from occurring after the liquid processing ends and before the plurality of wafers W are completely lifted.

Further, the IPA vapor is cooled by coming into contact with the surface of the wafer W. Thus, the IPA vapor is condensed on the surface of the wafer W, so that IPA in a liquid form is adsorbed on the surface of the wafer W, and the processing liquid adhering to the surface of the wafer W is replaced with IPA. In order to replace the processing liquid adhering to the surface of the wafer W with IPA as described above, it is preferable that the temperature difference between the IPA vapor and the wafer W is large. Meanwhile, since the temperature in the drying chamber 3 is higher than the temperature of the processing liquid, the plurality of wafers W rises in temperature by being lifted from the processing liquid. That is, the temperature difference between the IPA vapor and the wafer W is gradually reduced.

Meanwhile, in the substrate processing apparatus 1, since the IPA vapor is immediately supplied from the lower nozzle 61 to the wafer W immediately after being exposed from the liquid surface of the processing liquid, the IPA vapor having a high temperature may be supplied to the wafer W in a state closer to the temperature of the processing liquid. Accordingly, the processing liquid adhering to the surface of the wafer W may be efficiently replaced with IPA. Further, since the substrate processing apparatus 1 according to the first embodiment includes the cooler 244 that cools the processing liquid to be supplied to the storage tank 21, the temperature difference between the IPA vapor and the wafer W may be further increased as compared with, for example, a case where the processing liquid at about room temperature is used.

Further, in the related art, the entire drying chamber is filled with the IPA vapor by ejecting the IPA vapor from a nozzle provided in the drying chamber toward the ceiling of the drying chamber. Meanwhile, in the substrate processing apparatus 1, it is assumed that the IPA vapor is directly supplied to the plurality of wafers W. Accordingly, the supply efficiency of the IPA vapor to the wafer W may be increased as compared with the related art. In other words, the consumption of the IPA vapor may be reduced.

Furthermore, in the substrate processing apparatus 1, by forming the liquid film of IPA on the liquid surface of the processing liquid by the pre-lifting process, the IPA existing on the liquid surface of the processing liquid may adhere to the surface of the wafer W in a process of lifting the wafer W from the processing liquid in the lifting process. Thus, since the amount of the processing liquid remaining on the surface of the wafer W may be reduced, the efficiency of replacing the processing liquid with IPA may be increased as compared with a case where the pre-lifting process is not performed.

Further, in the lifting process, the controller 71 moves up the ejection position of the IPA vapor by the gas ejector 6 according to the height position of the plurality of wafers W moved up by the movement mechanism 5. Specifically, in the first embodiment, the controller 71 causes the ejection of the IPA vapor to be started in the order of the lower nozzle 61, the middle nozzle 62, and the upper nozzle 63 as the plurality of wafers W are moved up.

For example, the controller 71 controls the second supply system 65 to start the ejection of the IPA vapor from the middle nozzle 62 when the plurality of wafers W are moved up to a position where the IPA vapor ejected from the middle nozzle 62 is supplied to the upper ends of the plurality of wafers W (see FIG. 8). Further, the controller 71 controls the second supply system 65 to start the ejection of the IPA vapor from the upper nozzle 63 when the plurality of wafers W are moved up to a position where the IPA vapor ejected from the upper nozzle 63 is supplied to the upper ends of the plurality of wafers W (see FIG. 9).

As described above, the upper nozzle 63 ejects the IPA vapor obliquely upward. Thus, the IPA vapor may be continuously supplied to the upper portion of the wafer W as long as possible, and for example, the supply of the IPA vapor to the upper portion of the wafer W may be suppressed from being insufficient. In addition, it is conceivable to continuously supply the IPA vapor to the upper portion of the wafer W as long as possible, for example, by providing the upper nozzle 63 in the lid 32. However, but this may have a complicated piping configuration because the upper nozzle 63 is provided in the lid 32 that is moved up and down.

In addition, the controller 71 may detect the height position of the plurality of wafers W based on, for example, an output signal from a position detection unit such as an encoder provided on the holder 4 or the movement mechanism 5. Further, the controller 71 may calculate the height position of the plurality of wafers W based on the start time after the lifting process is started and the lifting speed of the plurality of wafers W which is a known value.

In this way, with the substrate processing apparatus 1 according to the first embodiment, the ejection of the IPA vapor is started in the order of the lower nozzle 61, the middle nozzle 62, and the upper nozzle 63 as the plurality of wafers W are moved up, so that the IPA vapor may always be continuously ejected from the vicinity of the wafers W. Accordingly, the IPA vapor may be efficiently supplied to the wafers W that are being lifted. Further, the consumption of IPA and $N_2$ gas may be suppressed as compared with a case where the IPA vapor is always continuously ejected from all of the nozzles 61 to 63 in the lifting process.

In addition, in the first embodiment, since the middle nozzle 62 and the upper nozzle 63 share the second supply system 65, it is assumed that the ejection of the hot $N_2$ gas from the upper nozzle 63 is stopped when the ejection of the IPA vapor from the middle nozzle 62 is started (see FIG. 8). However, the present disclosure is not limited thereto. For example, the controller 71 may start the ejection of the IPA vapor from the upper nozzle 63 in addition to starting the ejection of the IPA vapor from the middle nozzle 62. Further, by independently providing the middle nozzle 62, the upper nozzle 63, and the IPA vapor supply system, it is possible to start the ejection of the IPA vapor from the middle nozzle 62 while continuing the ejection of the hot $N_2$ gas from the upper nozzle 63.

Further, the controller 71 may sequentially switch the nozzles 61 to 63 that eject the IPA vapor, among the nozzles 61 to 63, to the nozzles 61 to 63 disposed at a higher tier according to the height position of the plurality of wafers W. That is, when starting the ejection of the IPA vapor from the middle nozzle 62, the controller 71 may control the first supply system 64 to switch the gas ejected from the lower nozzle 61 from the IPA vapor to the hot $N_2$ gas. Further, when starting the ejection of the IPA vapor from the upper nozzle 63, the controller 71 may control the second supply system 65 to stop the ejection of the IPA vapor from the middle nozzle 62. By doing so, the consumption of the IPA vapor may be further suppressed.

Subsequently, the post-lifting process is performed (step S105). In the post-lifting process, the controller 71 may control the shielding unit 33 to move the shielding door 331, so that the shielding door 331 is disposed at a position where it closes the lower opening in the main body 31 of the drying chamber 3. Thus, the drying chamber 3 is sealed by the lid 32 and the shielding door 331 (see FIG. 10). Further, the controller 71 controls the second supply system 65 to eject the hot $N_2$ gas from the upper nozzle 63. Thus, the volatilization of IPA remaining on the surfaces of the plurality of wafers W is promoted, and the plurality of wafers W are dried.

Further, in the post-lifting processing, the controller 71 controls the drainage mechanism 25 to open the valve 253, so that the processing liquid is ejected from the storage tank 21. At this time, the controller 71 controls the first supply system 64 to eject the hot $N_2$ gas from the lower nozzle 61.

Subsequently, in the substrate processing apparatus 1, a carry-out process is performed (step S106). In the carry-out process, the controller 71 controls the second supply system 65 to stop the ejection of the hot $N_2$ gas from the upper nozzle 63. Further, the controller 71 controls the movement mechanism 5 to move up the lid 32 and the holder 4 (see FIG. 11). Thereafter, the controller 71 controls the substrate conveyance device (not illustrated) to transfer the plurality of wafers W from the holding body 41 to the substrate conveyance device.

Subsequently, in the substrate processing apparatus 1, a storing process is performed (step S107). In the storing process, the controller 71 controls the movement mechanism 5 to move down the lid 32 and the holder 4, so that the drying chamber 3 is sealed. Further, the controller 71 controls the first supply system 64 and the second supply system 65 to eject the hot $N_2$ gas from the nozzles 61 to 63 (see FIG. 12). Then, the controller 71 controls the liquid ejector 24 to open the valve 245, so that the processing liquid is supplied to the storage tank 21. Thus, the processing liquid is stored in the storage tank 21 (see FIG. 13). When the storage processing ends, the controller 71 completes a series of substrate processings.

Second Embodiment

In the first embodiment described above, the plurality of nozzles 61 to 63 are provided in multiple tiers in the drying chamber 3 to start the supply of the IPA vapor in order from the lower nozzle 61, so that the ejection position of the IPA vapor is moved up as the plurality of wafers W are moved up. However, the method of moving up the ejection position of the IPA vapor as the plurality of wafers W are moved up is not limited to the above example, and the nozzle itself may be moved up.

Figure 14:
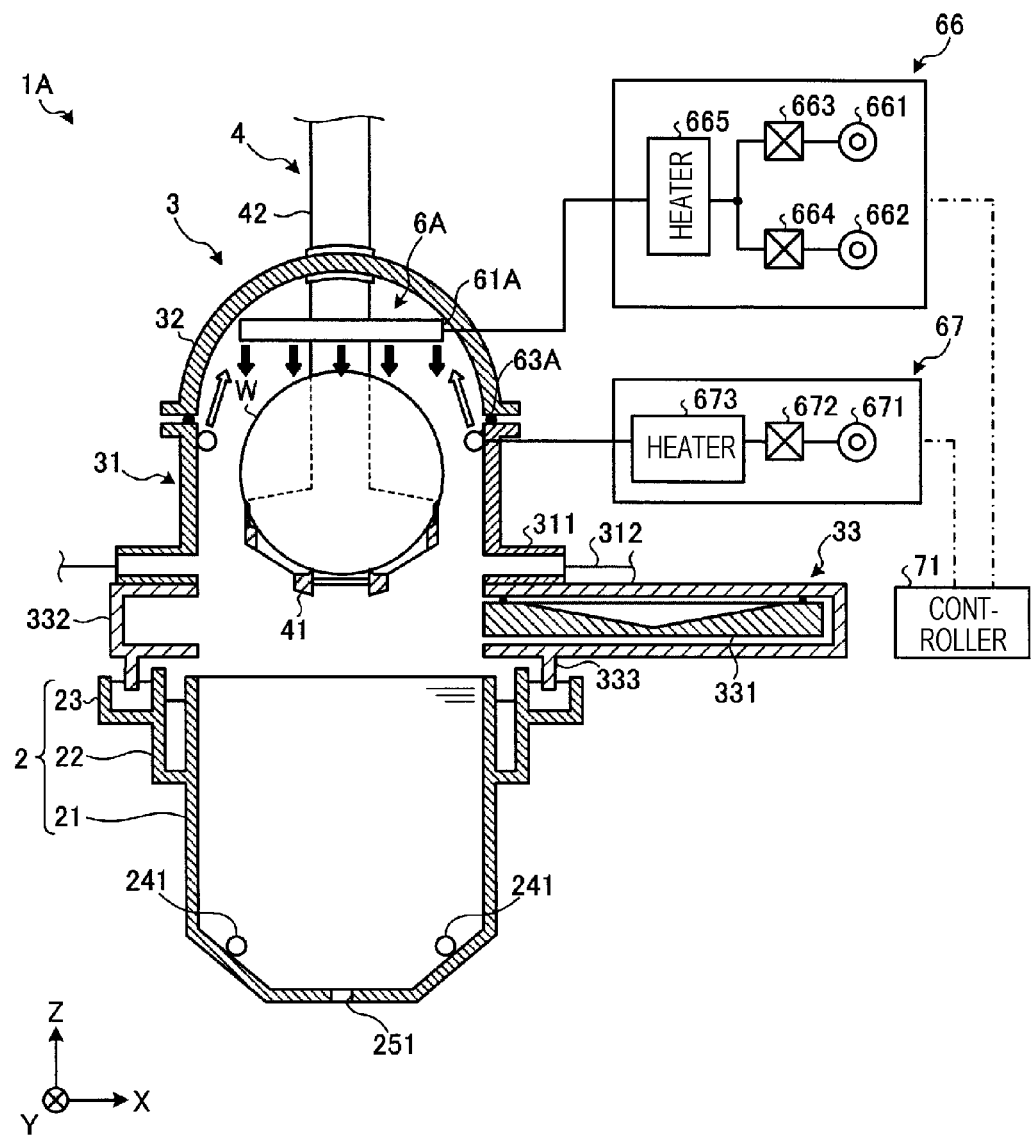
FIG. 14 is a cross-sectional view of a substrate processing apparatus according to a second embodiment.

FIG. 14 is a cross-sectional view of a substrate processing apparatus according to a second embodiment. As illustrated in FIG. 14, the substrate processing apparatus 1A according to the second embodiment includes a gas ejector 6A. The gas ejector 6A includes a movable nozzle 61A and a fixed nozzle 63A.

The movable nozzle 61A is a nozzle that is moved up along with the plurality of wafers W. In the second embodiment, the movable nozzle 61A is attached to the shaft 42 of the holder 4. Further, the movable nozzle 61A is disposed above the plurality of wafers W held by the holding body 41 so as to be close to the plurality of wafers W, and ejects an IPA vapor or hot $N_2$ gas downward toward the plurality of wafers W.

The movable nozzle 61A is, for example, a long nozzle extending in the direction (X-axis direction) orthogonal to the direction in which the plurality of wafers W are arranged. The gas ejector 6A includes a plurality of movable nozzles 61A along the direction in which the plurality of wafers W are arranged. Each movable nozzle 61A is provided with a plurality of ejection ports along the longitudinal direction. Alternatively, each movable nozzle 61A is provided with a slit-shaped ejection port extending in the longitudinal direction. In addition, a configuration of the movable nozzle 61A is not limited to the above example, and any configuration may be used as long as it may eject the IPA vapor downward toward the plurality of wafers W from above the plurality of wafers W.

The movable nozzle 61A is connected to a third supply system 66. The third supply system 66 includes an IPA supply source 661, an $N_2$ supply source 662, valves 663 and 664, and a heater 665. Such a configuration of the third supply system 66 is the same as that of the first supply system 64 described above. That is, when both the valves 663 and 664 are opened, an IPA vapor is supplied from the heater 665 to the movable nozzle 61A. When only the valve 664 is opened, hot $N_2$ gas is supplied from the heater 665 to the movable nozzle 61A. The valves 663 and 664 are electrically connected to the controller 71 and are controlled to be opened and closed by the controller 71.

The fixed nozzle 63A is a nozzle fixed to the drying chamber 3, and is disposed at, for example, the same position as the upper nozzle 63 described above. The fixed nozzle 63A extends along the direction (Y-axis direction) in which the plurality of wafers W are arranged and has a plurality of ejection ports along the longitudinal direction, similarly to the nozzles 61 to 63 described above. Alternatively, the fixed nozzle 63A may be provided with a slit-shaped ejection port extending in the longitudinal direction.

The fixed nozzle 63A is connected to a fourth supply system 67. The fourth supply system 67 includes an $N_2$ supply source 671, a valve 672, and a heater 673. $N_2$ gas supplied from the $N_2$ supply source 671 is heated by the heater 673 to generate hot $N_2$ gas, so that the hot $N_2$ gas is supplied to the fixed nozzle 63A. The valve 672 is electrically connected to the controller 71 and is controlled to be opened and closed by the controller 71. The fixed nozzle 63A ejects the hot $N_2$ gas supplied from the fourth supply system 67 obliquely upward toward, for example, the ceiling surface of the lid 32.

Figure 15:
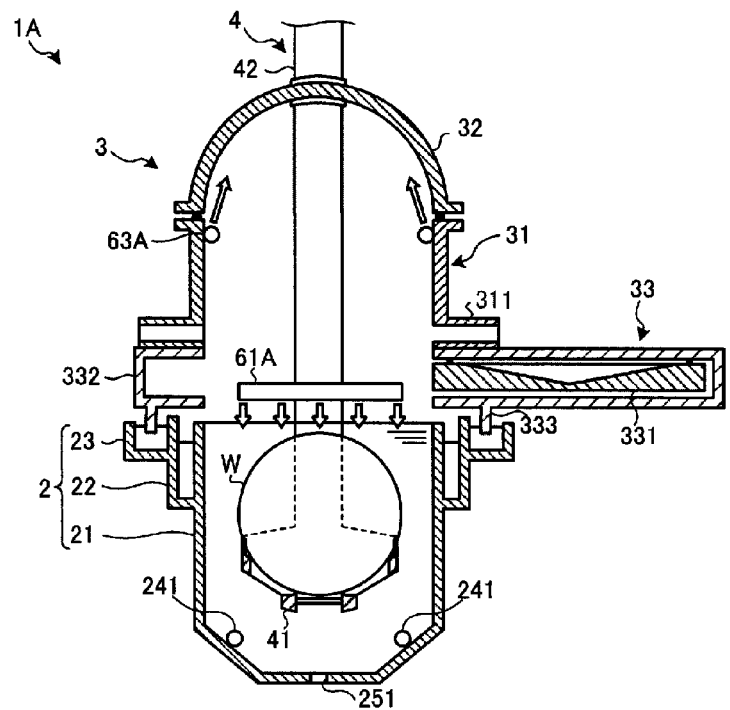
FIG. 15 is a diagram illustrating an exemplary operation of a liquid processing according to the second embodiment.
Figure 16:
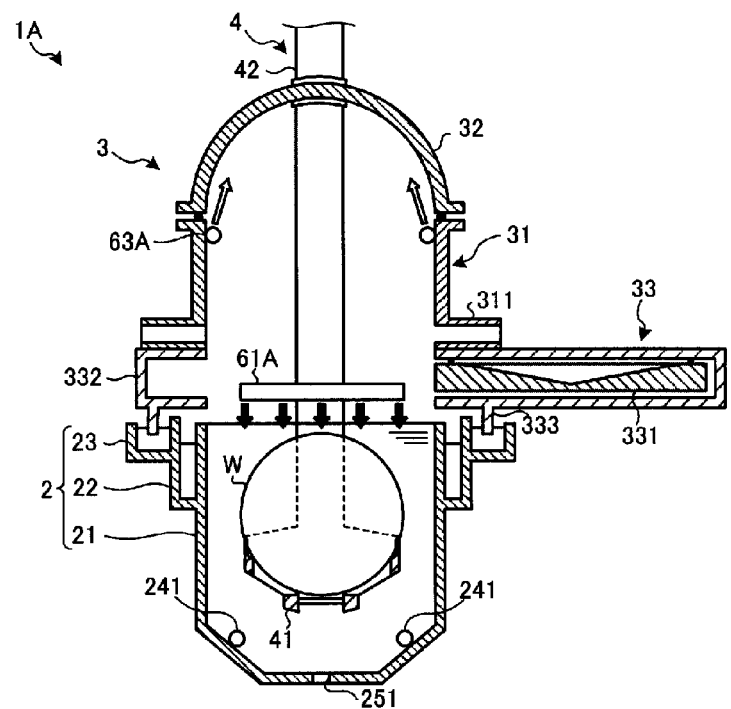
FIG. 16 is a diagram illustrating an exemplary operation of a pre-lifting process according to the second embodiment.
Figure 17:
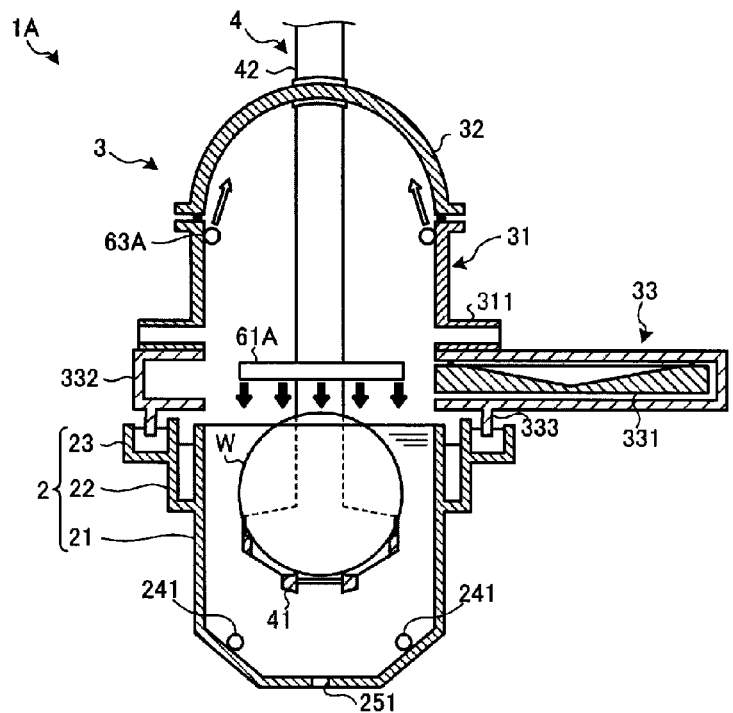
FIG. 17 is a diagram illustrating an exemplary operation of a lifting process according to the second embodiment.
Figure 18:
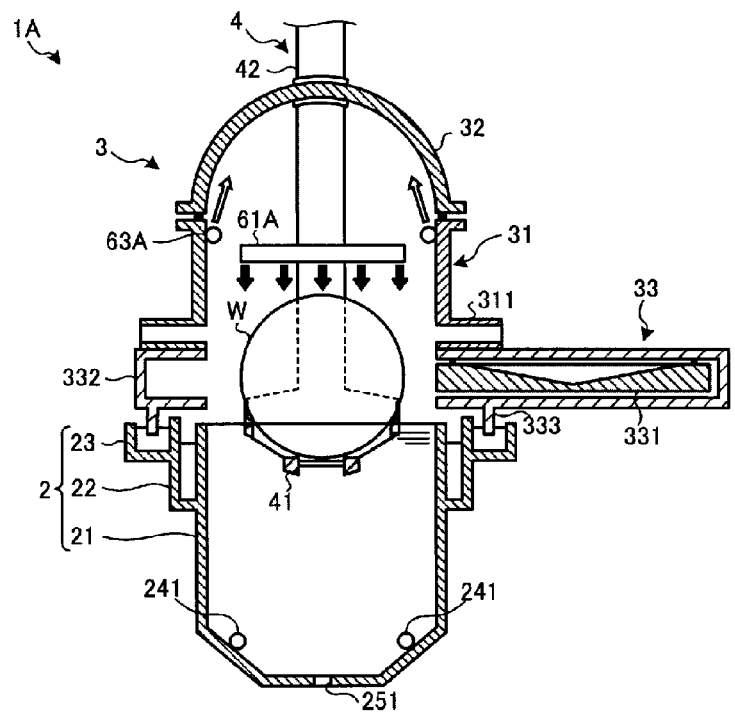
FIG. 18 is a diagram illustrating an exemplary operation of a lifting process according to the second embodiment.
Figure 19:
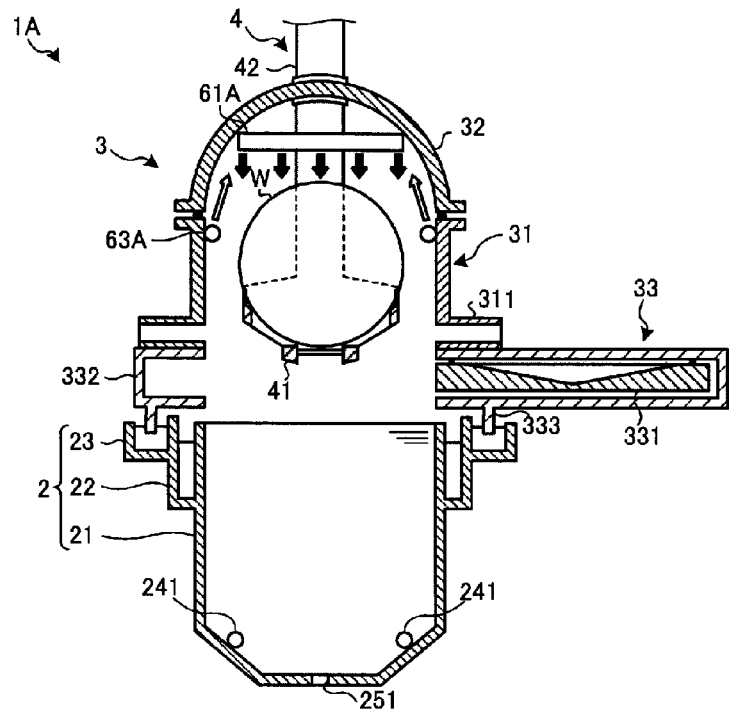
FIG. 19 is a diagram illustrating an exemplary operation of a lifting process according to the second embodiment.
Figure 20:
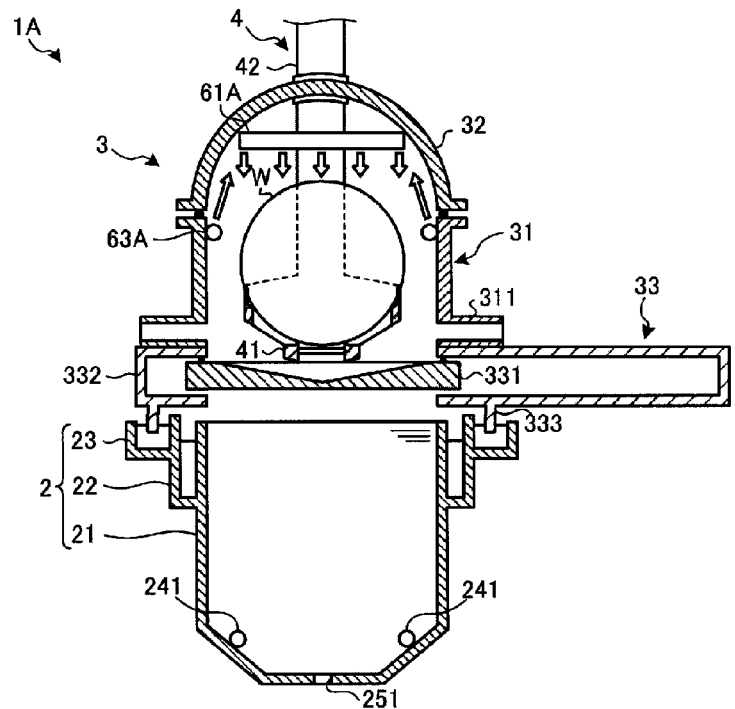
FIG. 20 is a diagram illustrating an exemplary operation of a post-lifting process according to the second embodiment.
Figure 21:
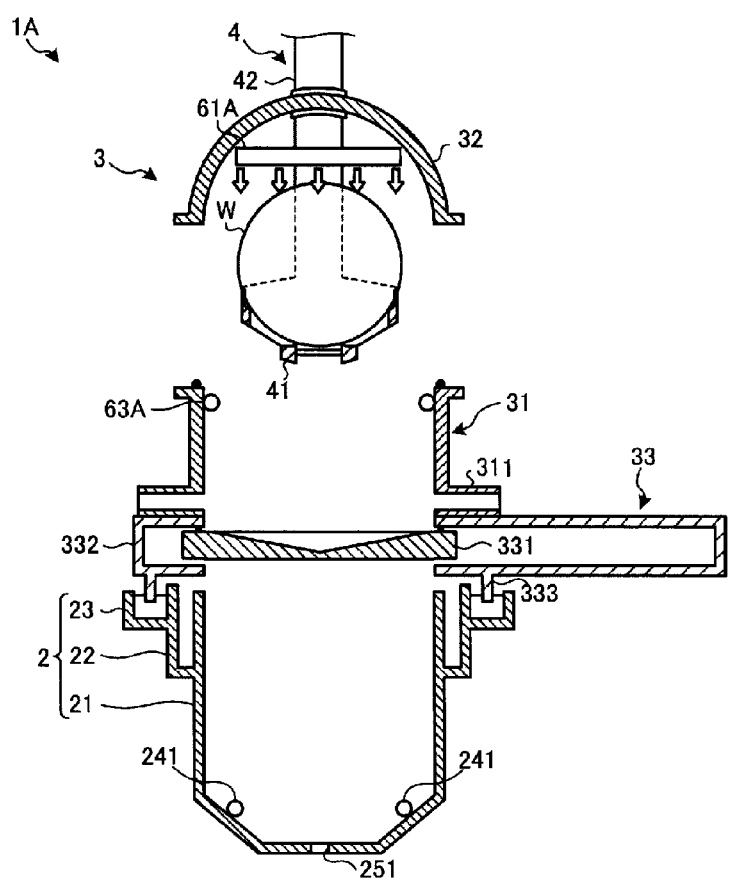
FIG. 21 is a diagram illustrating an exemplary operation of a carry-out process according to the second embodiment.
Figure 22:
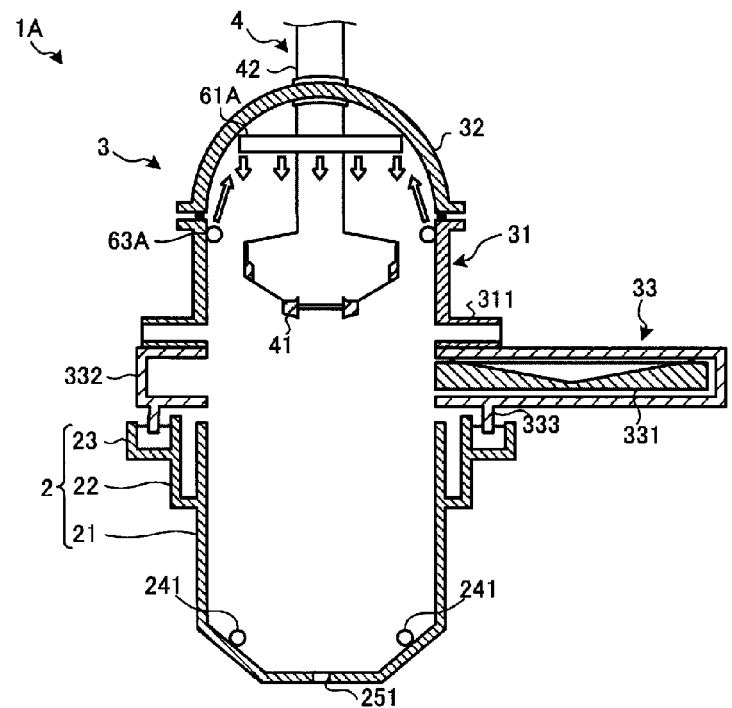
FIG. 22 is a diagram illustrating an exemplary operation of a storing process according to the second embodiment.
Figure 23:
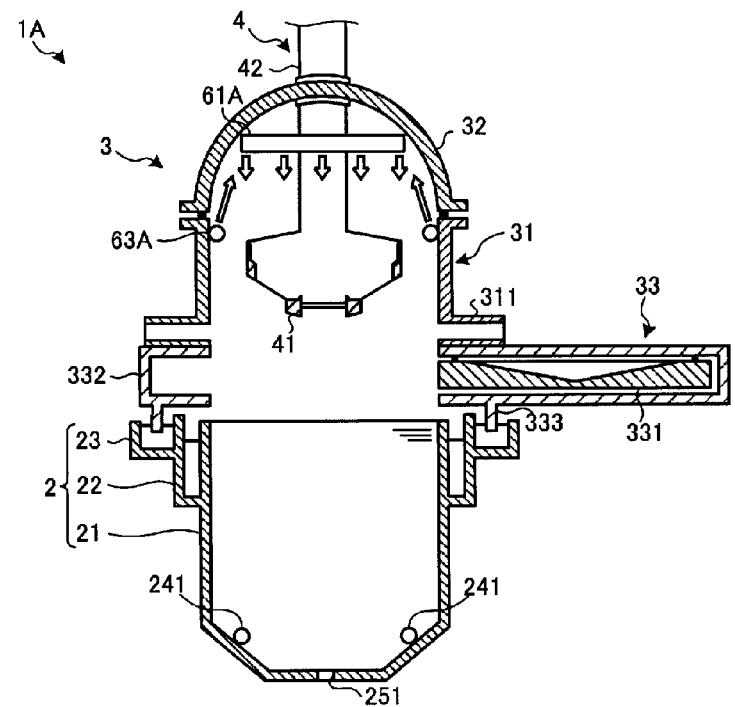
FIG. 23 is a diagram illustrating an exemplary operation of a storing process according to the second embodiment.

Next, a specific operation of the substrate processing apparatus 1A according to the second embodiment will be described with reference to FIGS. 15 to 23. FIG. 15 is a diagram illustrating an exemplary operation of a liquid processing, FIG. 16 is a diagram illustrating an exemplary operation of a pre-lifting process, FIGS. 17 to 19 are diagrams respectively illustrating an exemplary operation of a lifting process, and FIG. 20 is a diagram illustrating an exemplary operation of a post-lifting process. Further, FIG. 21 is a diagram illustrating an exemplary operation of a carry-out process, FIG. 22 is a diagram illustrating an exemplary operation of a storing process, and FIG. 23 is a diagram illustrating an exemplary operation of a storing process.

As illustrated in FIG. 15, in the liquid processing, the controller 71 controls the third supply system 66 and the fourth supply system 67 to eject the hot $N_2$ gas from the movable nozzle 61A and the fixed nozzle 63A.

Subsequently, as illustrated in FIG. 16, in the pre-lifting process, the controller 71 controls the third supply system 66 to switch the gas ejected from the movable nozzle 61A from the hot $N_2$ gas to the IPA vapor. Thus, a liquid film of IPA is formed on the liquid surface of the processing liquid stored in the storage tank 21. Since the movable nozzle 61A ejects the IPA vapor downward, the IPA vapor may be efficiently supplied to the liquid surface of the processing liquid.

Subsequently, as illustrated in FIG. 17, in the lifting process, the controller 71 controls the movement mechanism 5 to move up the shaft 42. Thus, the plurality of wafers W start to be exposed from the liquid surface of the processing liquid. The movable nozzle 61A is disposed above the plurality of wafers W so as to be close to the plurality of wafers W. Therefore, the movable nozzle 61A may supply the IPA vapor to the plurality of wafers W immediately after the plurality of wafers W are exposed from the liquid surface of the processing liquid. When the IPA vapor comes into contact with the surfaces of the plurality of wafers W, the processing liquid adhering to the surfaces of the plurality of wafers W is replaced with IPA.

Further, as illustrated in FIGS. 18 and 19, in the lifting process, the controller 71 moves up the plurality of wafers W while ejecting the IPA vapor from the movable nozzle 61A. Since the movable nozzle 61A is moved up along with the plurality of wafers W, the movable nozzle 61A may continuously eject the IPA vapor to the plurality of wafers W from a position close to the plurality of wafers W. Thus, since the IPA vapor is efficiently supplied to the plurality of wafers W, the processing liquid adhering to the plurality of wafers W may be efficiently replaced with IPA.

Further, in the lifting process, the controller 71 may increase the eject flow rate of the IPA vapor as the plurality of wafers W are moved up. Since the movable nozzle 61A is moved up along with the plurality of wafers W, the movable nozzle 61A gradually moves away from the liquid surface of the processing liquid. Meanwhile, by increasing the ejection flow rate of the IPA vapor, the IPA vapor may reach a position far away from the movable nozzle 61A. Therefore, by increasing the ejection flow rate of the IPA vapor as the plurality of wafers W are moved up (i.e., the movable nozzle 61A is moved up), the IPA vapor may reach the liquid surface of the processing liquid regardless of the height position of the movable nozzle 61A. Accordingly, the IPA vapor may be supplied to portions of the plurality of wafers W immediately after being exposed from the liquid surface of the processing liquid regardless of the height position of the movable nozzle 61A.

Subsequently, as illustrated in FIG. 20, in the post-lifting process, the controller 71 controls the third supply system 66 to switch the gas ejected from the movable nozzle 61A from the IPA vapor to the hot $N_2$ gas. Thus, by supplying the hot $N_2$ gas to the plurality of wafers W, the volatilization of IPA remaining on the surfaces of the plurality of wafers W is promoted, and the plurality of wafers W are dried.

Subsequently, as illustrated in FIG. 21, in the carry-out process, the controller 71 controls the fourth supply system 67 to stop the ejection of the hot $N_2$ gas from the fixed nozzle 63A. Further, the controller 71 controls the movement mechanism 5 to move up the lid 32 and the holder 4. Thereafter, the controller 71 controls the substrate conveyance device (not illustrated) to transfer the plurality of wafers W from the holding body 41 to the substrate conveyance device.

Here, in the carry-out process, the controller 71 continues to eject the hot $N_2$ gas from the movable nozzle 61A. In this way, with the substrate processing apparatus 1A according to the second embodiment, the hot $N_2$ gas may be continuously supplied to the plurality of wafers W even in the carry-out process. Therefore, for example, the time of the post-lifting process in the preceding step may be shortened.

Subsequently, as illustrated in FIGS. 22 and 23, in the storing process, the controller 71 controls the movement mechanism 5 to move down the lid 32 and the holder 4, so that the drying chamber 3 is sealed. Further, the controller 71 controls the third supply system 66 and the fourth supply system 67 to eject the hot $N_2$ gas from the movable nozzle 61A and the fixed nozzle 63A.

Other Embodiments

In the first embodiment, an example in which the lower nozzle 61 ejects the IPA vapor obliquely downward has been described, but the lower nozzle 61 may eject the IPA vapor horizontally. By ejecting the IPA vapor horizontally or obliquely downward from the lower nozzle 61, the IPA vapor may be supplied to the plurality of wafers W exposed from the liquid surface of the processing liquid at an early stage. Further, since the IPA vapor is not directly ejected to the liquid surface of the processing liquid by ejecting the IPA vapor horizontally from the lower nozzle 61, ripples on the liquid surface may be suppressed.

In the second embodiment, an example in which the movable nozzle 61A is attached to the holder 4 and is moved up along with the plurality of wafers W by the movement mechanism 5 has been described. The present disclosure is not limited thereto, and the gas ejector 6A may include a movement mechanism different from the movement mechanism 5 that moves up and down the movable nozzle 61A.

As described above, the substrate processing apparatus (e.g., the substrate processing apparatus 1 or 1A) according to the embodiment includes a liquid processing tank (e.g., the liquid processing tank 2), a movement mechanism (e.g., the movement mechanism 5), an ejector (e.g., the gas ejector 6 or 6A), and a controller (e.g., the controller 71). The liquid processing tank stores a processing liquid (e.g., deionized water) therein. The movement mechanism moves a plurality of substrates (e.g., wafers W) immersed in the liquid processing tank to above the liquid surface of the processing liquid. The ejector ejects a vapor of an organic solvent (e.g., IPA) toward portions of the plurality of substrates exposed from the liquid surface. The controller moves up the ejection position of the vapor by the ejector as the plurality of substrates are moved up.

In this way, since the vapor of the organic solvent may be continuously ejected in the vicinity of the plurality of substrates, the vapor of the organic solvent may be efficiently supplied to the plurality of substrates that being lifted. Accordingly, with the substrate processing apparatus according to the embodiment, the efficiency of replacement between the processing liquid and the organic solvent may be enhanced.

The ejector (e.g., the gas ejector 6) may include a plurality of nozzles (e.g., the lower nozzle 61, the middle nozzle 62, and the upper nozzle 63) arranged in multiple tiers. In this case, the controller (e.g., the controller 71) may cause the ejection of the vapor from the ejector to be sequentially started from the nozzle (e.g., the lower nozzle 61) disposed at the lowermost tier among the plurality of nozzles.

By starting the ejection of the vapor of the organic solvent in order from the nozzle disposed at a lower tier (e.g., in the order of the lower nozzle 61, the middle nozzle 62, and the upper nozzle 63) as the plurality of substrates are moved up, the vapor of the organic solvent may be continuously ejected in the vicinity of the plurality of substrates. Further, the consumption of the vapor of the organic solvent may be suppressed as compared with a case where the vapor of the organic solvent is always continuously ejected from all of the plurality of nozzles while the plurality of substrates are moved up.

The controller (e.g., the controller 71) may sequential switch the nozzles that eject the vapor of the organic solvent, among the plurality of nozzles (e.g., the lower nozzle 61, the middle nozzle 62, and the upper nozzle 63), to the nozzles disposed at a higher tier as the plurality of substrates are moved up. That is, for example, the vapor of the organic solvent may be ejected only from the lower nozzle 61, then, the vapor of the organic solvent may be ejected only from the middle nozzle 62, and finally, the vapor of the organic solvent may be ejected only from the upper nozzle 63. Thus, the consumption of the vapor of the organic solvent may be suppressed.

The plurality of nozzles (e.g., the lower nozzle 61, the middle nozzle 62, and the upper nozzle 63) may be arranged on the side of the moving path of the plurality of substrates by the movement mechanism. In this case, the nozzle (e.g., the lower nozzle 61) disposed at the lowermost tier among the plurality of nozzles may eject the vapor horizontally or diagonally downward. Thus, the vapor of the organic solvent may be supplied to the plurality of substrates exposed from the liquid surface of the processing liquid at an early stage.

The nozzle (e.g., the lower nozzle 61) disposed at the lowermost tier, among the plurality of nozzles, may be disposed at a position lower than the height position of the upper ends of the plurality of substrates when the upper halves of the plurality of substrates have been completely exposed from the liquid surface. In this way, by disposing the nozzle disposed at the lowermost tier, among the plurality of nozzles, near the liquid surface of the processing liquid, the vapor of the organic solvent may be supplied to the plurality of substrates immediately after the plurality of substrates are exposed from the liquid surface of the processing liquid.

The ejector (e.g., the gas ejector 6A) may include a nozzle (e.g., the movable nozzle 61A) that is moved up along with the plurality of substrates. By moving up the nozzle along with the plurality of substrates, since the vapor of the organic solvent may always be supplied from the same position to the plurality of substrates regardless of the height position of the plurality of substrates, the vapor of the organic solvent may be efficiently supplied to the plurality of substrates that are being lifted. Accordingly, with the substrate processing apparatus (e.g., the substrate processing apparatus 1A) according to the embodiment, the efficiency of replacement between the processing liquid and the organic solvent may be enhanced.

The nozzle (e.g., the movable nozzle 61A) may be provided on the movement mechanism (e.g., the movement mechanism 5). Thus, a configuration of the substrate processing apparatus (e.g., the substrate processing apparatus 1A) may be simplified as compared with a case where a movement mechanism that moves up the nozzle is provided separately from the movement mechanism that moves up the plurality of substrates.

The nozzle (e.g., the movable nozzle 61A) may be disposed above the plurality of substrates. In this case, the nozzle may eject the vapor downward toward the upper ends of the plurality of substrates. Thus, the vapor of the organic solvent may be continuously supplied to the plurality of substrates from above the plurality of substrates regardless of the height position of the plurality of substrates. Further, by ejecting the vapor of the organic solvent downward from above the plurality of substrates, first, the processing liquid adhering to the upper portions of the plurality of substrates is replaced with the organic solvent. Thereafter, the liquefied organic solvent falls down along the surfaces of the substrates due to gravity, so that the processing liquid adhering to portions of the plurality of substrates other than the upper portions thereof may be efficiently replaced with the organic solvent.

The ejector (e.g., the gas ejector 6 or 6A) may start the ejection of the vapor of the organic solvent before the plurality of substrates are exposed from the liquid surface of the processing liquid. Thus, a liquid film of the organic solvent may be formed on the liquid surface of the processing liquid before the plurality of substrates are exposed from the liquid surface of the processing liquid. Therefore, in the subsequent process of lifting the plurality of substrates from the processing liquid, the organic solvent existing on the liquid surface of the processing liquid may adhere to the surfaces of the substrates. Thus, since the amount of the processing liquid remaining on the surfaces of the substrates may be reduced, the efficiency of replacing the processing liquid with the organic solvent may be increased.

The substrate processing apparatus (e.g., the substrate processing apparatus 1 or 1A) according to the embodiment may include a cooler (e.g., the cooler 244) that cools the processing liquid. Thus, the temperature difference between the vapor of the organic solvent and the substrate may be increased as compared with a case where the processing liquid is not cooled. Accordingly, the efficiency of replacing the processing liquid with the organic solvent may be increased.

According to the present disclosure, in a technology to dry a substrate by bringing a vapor of an organic solvent into contact with the substrate to which a processing liquid has adhered, it is possible to improve the efficiency of replacement between the processing liquid and the organic solvent.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a liquid processing tank configured to store a processing liquid;
   a mover configured to move a plurality of substrates immersed in the liquid processing tank to a position above a liquid surface of the processing liquid;
   an ejector configured to eject a vapor of an organic solvent toward portions of the plurality of substrates exposed from the liquid surface; and
   a controller configured to move up an ejection position of the vapor by the ejector as the plurality of substrates are moved to the position above the liquid surface of the processing liquid.

2. The substrate processing apparatus according to claim 1, wherein the ejector includes a plurality of nozzles arranged in multiple tiers, and
   the controller causes the ejector to start ejection of the vapor sequentially from a nozzle disposed at a lowermost tier among the plurality of nozzles.

3. The substrate processing apparatus according to claim 2, wherein the controller sequentially switches a nozzle that ejects the vapor among the plurality of nozzles to a nozzle disposed at a higher tier as the plurality of substrates are moved to the position above the liquid surface of the processing liquid.

4. The substrate processing apparatus according to claim 3, wherein the plurality of nozzles are arranged on a lateral side of a moving path of the plurality of substrates by the mover, and
   the nozzle disposed at the lowermost tier among the plurality of nozzles ejects the vapor horizontally or obliquely downward.

5. The substrate processing apparatus according to claim 3, wherein the nozzle disposed at the lowermost tier among the plurality of nozzles is disposed at a position lower than a height position of upper ends of the plurality of substrates when upper halves of the plurality of substrates have been completely exposed from the liquid surface.

6. The substrate processing apparatus according to claim 2, wherein the plurality of nozzles are arranged on a lateral side of a moving path of the plurality of substrates by the mover, and
   wherein the nozzle disposed at the lowermost tier among the plurality of nozzles ejects the vapor horizontally or obliquely downward.

7. The substrate processing apparatus according to claim 2, wherein the nozzle disposed at the lowermost tier among the plurality of nozzles is disposed at a position lower than a height position of upper ends of the plurality of substrates when upper halves of the plurality of substrates have been completely exposed from the liquid surface.

8. The substrate processing apparatus according to claim 2, wherein the ejector starts the ejection of the vapor before the plurality of substrates are exposed from the liquid surface of the processing liquid.

9. The substrate processing apparatus according to claim 2, further comprising a cooler configured to cool the processing liquid.

10. The substrate processing apparatus according to claim 1, wherein the ejector includes a nozzle that is moved up along with the plurality of substrates.

11. The substrate processing apparatus according to claim 10, wherein the nozzle is provided on the mover.

12. The substrate processing apparatus according to claim 10, wherein the nozzle is disposed above the plurality of substrates and configured to eject the vapor downward toward upper ends of the plurality of substrates.

13. The substrate processing apparatus according to claim 10, wherein the ejector starts the ejection of the vapor before the plurality of substrates are exposed from the liquid surface of the processing liquid.

14. The substrate processing apparatus according to claim 1, wherein the ejector starts the ejection of the vapor before the plurality of substrates are exposed from the liquid surface of the processing liquid.

15. The substrate processing apparatus according to claim 1, further comprising a cooler configured to cool the processing liquid.

16. The substrate processing apparatus according to claim 1, wherein the nozzle is provided on the mover.

17. A substrate processing method comprising:
   immersing a plurality of substrates in a processing liquid stored in a liquid processing tank;
   moving the plurality of substrates to a position above a liquid surface of the processing liquid after the liquid processing; and
   ejecting a vapor of an organic solvent toward portions of the plurality of substrates exposed from the liquid surface during the moving,
   wherein the ejecting includes moving up an ejection position of the vapor as the plurality of substrates are moved to the position above the liquid surface of the processing liquid.

18. A non-transitory computer-readable storage medium having stored therein a program that causes a computer to perform the substrate processing method according to claim 17.

* * * * *